(12) United States Patent
Wendell

(10) Patent No.: US 7,834,663 B2
(45) Date of Patent: Nov. 16, 2010

(54) NAND/NOR REGISTERS

(75) Inventor: Dennis Wendell, Sunnyvale, CA (US)

(73) Assignee: Oracle America, Inc., Redwood City, CA (US)

(*) Notice: Subject to any disclaimer, the term of this patent is extended or adjusted under 35 U.S.C. 154(b) by 44 days.

(21) Appl. No.: 11/737,103

(22) Filed: Apr. 18, 2007

(65) Prior Publication Data

US 2008/0258775 A1 Oct. 23, 2008

(51) Int. Cl.
*H03K 19/20* (2006.01)

(52) U.S. Cl. .................. 326/104; 326/40; 327/241; 365/240

(58) Field of Classification Search .............. 326/40, 326/104; 327/241; 365/78, 189.12, 240
See application file for complete search history.

(56) References Cited

U.S. PATENT DOCUMENTS

| | | | | |
|---|---|---|---|---|
| 3,609,569 A | * | 9/1971 | Todd | 327/202 |
| 3,808,544 A | * | 4/1974 | Walker | 327/202 |
| 4,150,305 A | * | 4/1979 | Streit et al. | 377/116 |
| 4,300,060 A | * | 11/1981 | Yu | 327/197 |
| 4,441,198 A | * | 4/1984 | Shibata et al. | 377/78 |
| 4,868,511 A | * | 9/1989 | Des Brisay, Jr. | 327/141 |
| 5,142,555 A | * | 8/1992 | Whiteside | 375/327 |
| 5,754,879 A | * | 5/1998 | Johnston | 712/39 |
| 5,781,053 A | * | 7/1998 | Ramirez | 327/215 |
| 6,710,637 B1 | * | 3/2004 | Chan | 327/259 |
| 2003/0141911 A1 | * | 7/2003 | Steiss et al. | 327/202 |
| 2004/0105504 A1 | * | 6/2004 | Chan | 375/257 |
| 2004/0263229 A1 | * | 12/2004 | Minzoni | 327/215 |
| 2006/0022717 A1 | * | 2/2006 | Park | 327/2 |

OTHER PUBLICATIONS

Rhyne "Fundamentals of Digital System Design" N.J. 1973 pp. 70-71.*

* cited by examiner

*Primary Examiner*—James H. Cho
*Assistant Examiner*—Jason Crawford
(74) *Attorney, Agent, or Firm*—Osha • Liang LLP

(57) ABSTRACT

A register receives an input signal and provides output signals that represent true complementary logic values of the input signal. One implementation of the register includes: a first stage circuit and a second stage circuit. After the output signals are derived, the second stage circuit provides feedback signals to block further propagation of the logic value of the input signal from the first stage circuit to the second stage circuit.

24 Claims, 3 Drawing Sheets

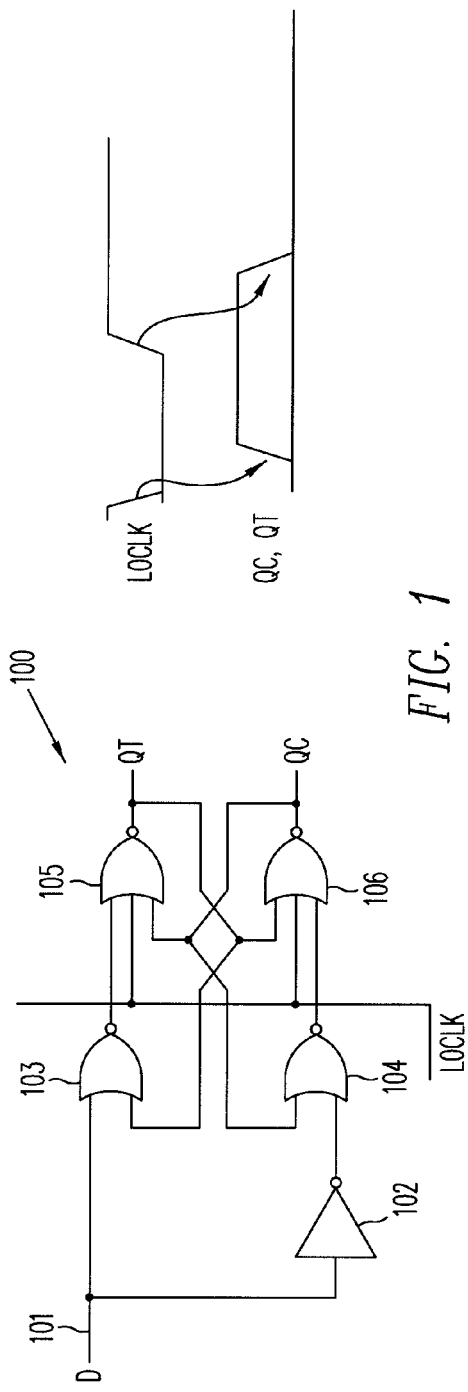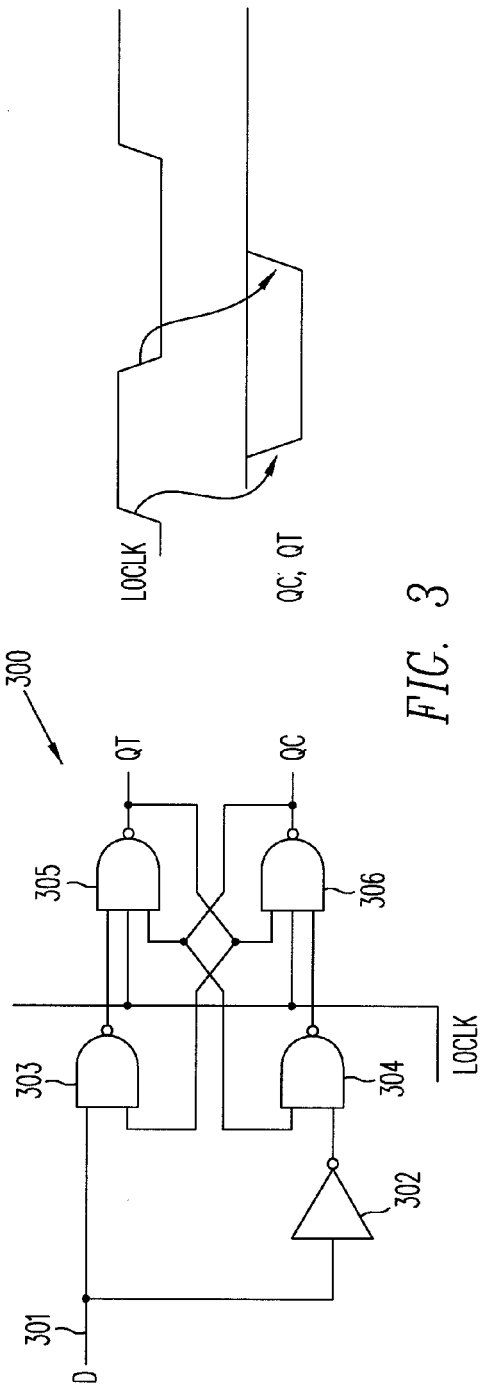

NAND/NOR REGISTERS

BACKGROUND OF THE INVENTION

A sense amplifier-based monotonic register ("SA-based register") is a register element (also known as a latch element) that has a first stage that is a sense amplifier. "Monotonic" refers to a data transition characteristic of the true and complement output signals of the latch. The true and complement output signals are "monotonic" when exactly one of these output signals transitions, and transitions only once, during a given clock period.

FIG. 4 shows an example of a conventional SA-based register 400. This SA-based register has one drawback, stemming from the fact that its output signals Q and $\overline{Q}$ develop while the sense amplifier is clocked. During that time, as clock signal CLK switches on NMOS transistor NL and switches off PMOS transistors P3 and P4, one or both of the voltages of output signals QT and QC may drop when the node becomes high impedance and a capacitive voltage divider is formed between the capacitive load the node is driving and the drain/channel capacitance one of cross-coupled NMOS transistors N1 and N2, as the transistor turns on. As these output signals QT and QC are also regenerative feedback signals that would amplify any small voltage difference between the gate terminals of NMOS transistors N3 and N4 immediately, leading to a metastable condition. Such a metastable condition may result in erroneous operation (i.e., an incorrect data value being captured at the output terminals), particularly when a device mismatch condition exists, as discussed in further detail below. The correct operation of the SA-based register is thus sensitive to the slew rate of the clock signal. To minimize the chance of a metastable condition from developing, additional transistors are often added to avoid a consequential differential signal from developing at sensitive internal nodes during a clock signal transition.

SA-based registers are sensitive to device mismatches. Inevitable manufacturing variations in channel lengths or widths of transistors or other device characteristics (e.g., threshold voltages) may result in mismatch or imbalance in transistor pairs that are required to be matching or balanced for correct operation. In addition, manufacturing imperfection may result in stress-induced enhanced mobility effects in the transistors that are known to be sources of erroneous operations in SA-based registers. Also, asymmetric effects (e.g., asymmetrical loads at the terminals of a differential output terminal) may result in poor rejection of power supply noise. The SA-registers are particularly vulnerable to power supply noise during activation. The initial conditions at internal nodes and leakage from such internal nodes may also lead to erroneous operations in an SA-based register.

SUMMARY OF THE INVENTION

According to one embodiment of this invention, a register receives an input signal and provides output signals that represent true complementary logic values of the input signal. One implementation of the register includes a first stage circuit and a second stage circuit. After the output signals are derived, the second stage circuit provides feedback signals to block further propagation of the logic value of the input signal from the first stage circuit to the second stage circuit.

This invention is better understood upon consideration of the detailed description below in conjunction with the accompanying drawings.

BRIEF DESCRIPTION OF THE DRAWINGS

FIG. 1 shows register element 100, in accordance with one embodiment of this invention.

FIG. 3 illustrates a second embodiment of this invention.

DETAILED DESCRIPTION OF THE PREFERRED EMBODIMENTS

Figure 2A:
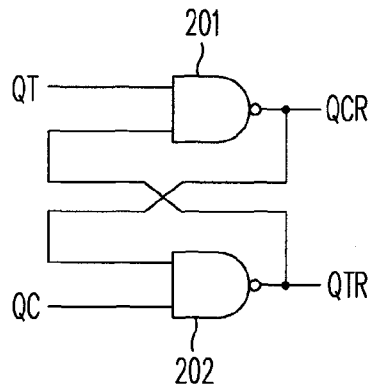
FIGS. 2(a) and 2(b) show, respectively, cross-coupled NAND gates 201 and 202 and cross-coupled NOR gates 203 and 204, which may be added as a third stage to register element 100 of FIG. 1 or register element 300 of FIG. 3 to provide fully registered output signals, according to one embodiment of this invention.

This invention provides a register element which overcome some of the disadvantages of SA-based registers of the prior art. According to one embodiment of this invention, a register includes a first stage and a second stage. A clock signal latches the output signal or signals of the first stage into the second stage. In addition, the output signals of the second stage are then fed back to the first stage after a hold time delay in order to lock out further propagation of the input value to the output signals. Accordingly, a monotonic output is achieved.

FIG. 1 shows register element 100, in accordance with one embodiment of this invention. As shown in FIG. 1, register element 100 receives an input bit at terminal 101. Consider, at a set-up phase, the clock signal $\overline{\text{L0CLK}}$ is inactive (i.e., deasserted, which is logic HIGH or '1' in this case). At this time, the output signals QC and QT are each pre-charged to logic value LOW (i.e., logic '0'), so that the logic values at the data input terminals of both NOR gates 103 and 104 are allowed to propagate. Because of inverter 102, the output logic values of NOR gates 103 and 104 are the complementary value and the true value of the logic value at terminal 101, respectively. In this set-up phase, clock signal $\overline{\text{L0CLK}}$ prevents changes in logic values at the output terminals of NOR gates 103 and 104 from affecting the output signals QC and QT of NOR gates 105 and 106.

When clock signal $\overline{\text{L0CLK}}$ becomes active (i.e., transitions from logic '1' to logic '0'), an evaluation phase is entered. In the evaluation phase, NOR gates 105 and 106 are unblocked, so that their output logic values are allowed to change. Output signals QC and QT of NOR gates 105 and 106 become the true value and the complementary value of the logic value at terminal 101, respectively. If the value of output signal QT is logic '1' (i.e., the value of output signal QC is logic '0'), data propagation at NOR gates 103 and 106 are blocked. Alternatively, if the value of output signal QT is logic '0' (i.e., the logic value of output signal QC is logic '1'), data propagation at NOR gates 104 and 105 are blocked. In either case, no further change in either one of output signals QT and QC may occur until clock signal $\overline{\text{L0CLK}}$ becomes inactive, when the next pre-charge cycle for output signals QT and QC begins.

NOR gates 105 and 106 can be sized to drive their respective expected output loads. FIG. 2(a) shows cross-coupled NAND gates 201 and 202. Cross-coupled NAND gates 201 and 202 can be used as a third stage to convert the monotonic output terminals of NOR gates 105 and 106 (i.e., signals QT and QC) to full register output terminals (i.e., signals QTR and QCR), so that, even when clock signal L0CLK returns to output logic HIGH value, the resulting quiescent or pre-charged states of signals QT and QC would not change the states of output signals QTR and QCR.

A second embodiment of this invention is illustrated by way of example by FIG. 3. FIG. 3 shows register element 300, in accordance with one embodiment of this invention. As shown in FIG. 3, register element 300 receives an input bit at terminal 301. In the set-up phase, the clock signal L0CLK is inactive (in this case, logic '0' or LOW), and the output signals QC and QT are pre-charged to logic '1', so that the logic values at the data input terminals of both NAND gates 303 and 304 are allowed to propagate. Because of inverter 302, the output logic values of NAND gates 303 and 304 are the complementary value and the true value of the logic value at terminal 101, respectively. In this set-up phase, clock signal L0CLK prevents changes in logic values at the output terminals of NAND gates 303 and 304 from affecting the output signals QC and QT of NAND gates 305 and 306. When clock signal L0CLK becomes active (i.e., transitions from logic '0' to logic '1') during the evaluation phase, NAND gates 305 and 306 are unblocked, so that their output logic values are allowed to change. Output signals QC and QT of NAND gates 305 and 306 become the true value and the complementary value of the logic value at terminal 101, respectively. If the value of output signal QT is logic '1' (i.e., the value of output signal QC is logic '0'), data propagation at NAND gates 304 and 305 are blocked. Alternatively, if the value of output signal QT is logic '0' (i.e., the logic value of output signal QC is logic '1'), data propagation at NAND gates 303 and 306 are blocked. In either case, no further change in either one of output signals QT and QC may occur until clock signal L0CLK becomes inactive, when the next pre-charge cycle for output signals QT and QC begins.

Figure 2B:
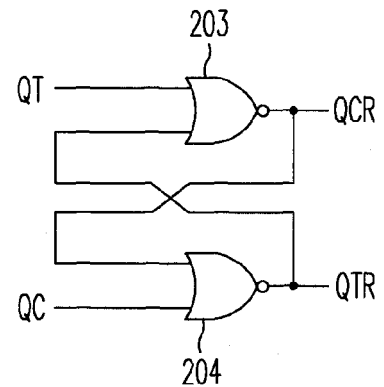
Figure 4:
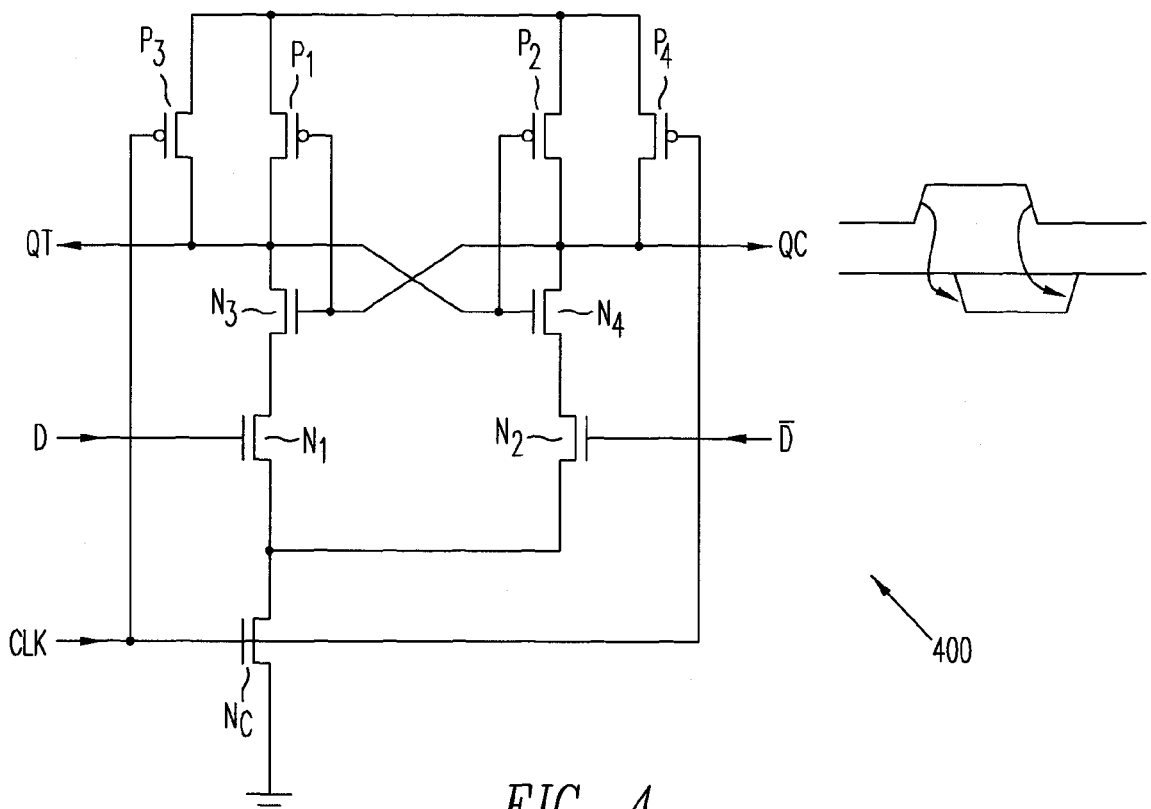
FIG. 4 shows an example of a conventional SA-based register 400.

Cross-coupled NOR gates 203 and 204 of FIG. 2(b) can be used to convert the monotonic output terminals of NAND gates 305 and 306 (i.e., signals QT and QC) to full register output terminals (i.e., signals QTR and QCR), where desired. These gates may be sized according to the output loads to be driven.

Figure 5:
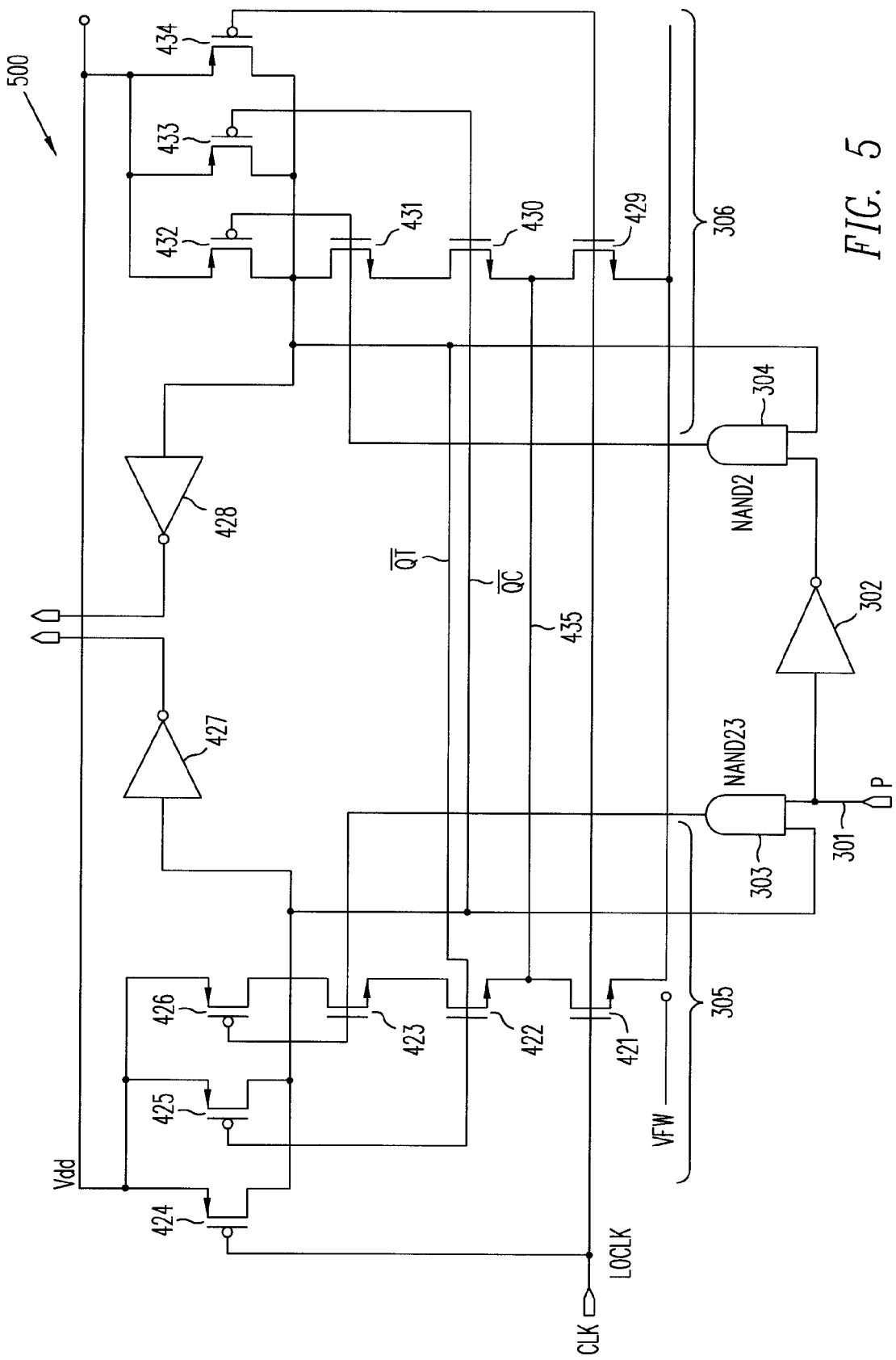
FIG. 5 shows one implementation of register element 300 of FIG. 3.

FIG. 5 shows one implementation 500 of register element 300 of FIG. 3. To facilitate cross-reference the corresponding elements in these figures are provided the same reference numerals. Implementation 500 may be manufactured, for example, using a 65 nm process. To design such a process, the transistors may have "drawn" channel lengths of 60 nm, for example. As shown in FIG. 5, a first stage includes inverter 302 and 2-input NAND gates 303 and 304. Inverter 302 can be provided by a PMOS transistor of 0.6 µm width and an NMOS transistor of 0.3 µm width. NAND gates 303 and 304 can be provided by, for example, PMOS and NMOS transistors each of 0.6 µm width. FIG. 5 shows the transistor schematic for 3-input NAND gates 305 and 306. As shown in FIG. 5, NAND gate 305 includes PMOS transistors 424, 425 and 426, NMOS transistors 421, 422 and 423, and inverter 427. PMOS transistor 424, which receives clock signal L0CLK as an input signal can be provided, for example, a 0.75 µm width, while PMOS transistors 425 and 426 each be provided a smaller width (e.g., a 0.32 µm width). Similarly, NMOS transistor 421 can be provided a 1.31 µm width, and NMOS transistors 422 and 423 can each be provided a a 1.1 µm width.

The transistors receiving clock signal L0CLK are provided larger values to ensure fast transition between set-up and evaluation modes, as these transistors are required to return the output nodes to the quiescent or precharge voltage levels. NAND gates 303 and 304 can each be provided a larger size to lower the fan-out loads represented by the intermediate nodes (e.g., the input terminal of NAND gate 305 or 306). A lower data set-up time can be thereby achieved, in theory, at the expense of greater power and higher input capacitance (i.e., as seen by the data signal at terminal 101 (FIG. 1) or 301 (FIG. 3)). The higher input capacitance may not be significant, as it likely constitutes merely a small interconnect capacitance. A similar optimization is available to the feed-back input to the second stage (i.e., smaller PMOS. transistors that is not driven by the clock signal). In the second stage, the larger NMOS transistor widths relative to the PMOS transistor widths are provided to allow rapid evaluation at the semi-dynamic output nodes, thereby decreasing the data input to output delay.

Hold time of the register is determined by the delay between the clock transition to the feedback signal at NAND gates 303 and 304.

Inverter 427 can be provided by a PMOS transistor of a 1.5 µm width and an NMOS transistor of a 0.5 µm width, for example. Inverter 427 is typically sized according to the output load it is expected to drive. Similarly, NAND gate 306 is shown to include PMOS transistors 432, 433 and 434, NMOS transistors 429, 430 and 431, and inverter 428. The transistors in NAND gate 306 can be sized similar to the transistors of NAND gate 305, if desired. However, it is not necessary. The transistors of NAND 306 can be sized according to the expected output loading.

Common node 435 is provided connecting the drain terminals of NMOS transistors 421 and 429, provided to minimize the load on clock signal L0CLK, given that only one of the outputs of NAND gates 303 and 304 is at logic high. During the set-up phase, however, common node 435 is loaded only by the capacitance of the N$^+$ diffusion regions of NMOS transistors 431 and 429, and their gate overlap capacitances. Common node 435 eliminates the output load seen by the clock signal during set-up phase.

The register elements of this invention are especially suitable for use, for example, in (a) the address or command decode circuits for static random access memories (SRAMs), read-only memories (ROMs) and register files; (b) any dynamic circuit; (c) content addressable memories (CAMs) and ternary CAMs (TCAMs); (d) fast adders, arithmetic logic units (ALUs), Booth coder/decoders for Booth multipliers; (e) any decoding circuit, and (f) synchronizer circuits. For example, in the address and command decode circuits of SRAMs, ROMs or register files, the registers of this invention provides complimentary monotonic data which speeds up read/write accesses and lowers power dissipation, In CAM or TCAM applications, the registers elements of the present invention provides the required monotonic results in comparisons of key data. In adders and ALU applications, the register elements of this invention allow operands to be stored and output as dual rail domino signals, thus allowing interface with dual dynamic domino logic circuits often found in these same applications. In general, the registers of this invention allows lower power, smaller silicon area and low-voltage operations.

The hardware described above, including any logic or transistor circuit, may be generated automatically by computer based on a description of the hardware expressed in the syntax and the semantics of a hardware description language, as known by those skilled in the art. Applicable hardware description languages include those provided at the layout, circuit netlist, register transfer, and schematic capture levels. Examples of hardware description languages include GDS II and OASIS (layout level), various SPICE languages and IBIS (circuit netlist level), Verilog and VHDL (register transfer level) and Virtuoso custom design language and Design Architecture-IC custom design language (schematic capture level).

The above detailed description is provided to illustrate the specific embodiments of this invention and is not intended to be limiting. Numerous modification and variations within the scope of this invention are possible. This invention is set forth in the following accompanying claims.

I claim:

1. A register receiving an input signal and providing output signals that represent true complementary logic values of the input signal, comprising:
   a first stage circuit receiving the input signal and feedback signals, and providing true and complementary intermediate signals derived from the logic value of the input signal when the feedback signals are deactivated, wherein the input signal is independent of a clocking signal, wherein the input signal is independent of a clocking signal; and
   a second stage circuit receiving the clocking signal, the true and complementary intermediate signals, and the feedback signals, wherein (a) during a first phase of the clocking signal, the second stage circuit deactivates the feedback signals and precharges the output signals; and (b) during a second phase of the clocking signal, the second stage circuit derives the output signals from the true and complementary intermediate signals and thereafter activates the feedback signals to block further propagation of the logic value of the input signal by the first stage circuit to the second stage circuit.

2. A register as in claim 1, wherein the activated output signals also serve as the activated feedback signals.

3. A register as in claim 1, wherein the second stage circuit comprises cross coupled logic gates enabled by the clocking signal.

4. A register as in claim 1 wherein the first stage circuit and the second stage circuit each comprise NAND gates.

5. A register as in claim 1 wherein the first stage circuit and the second stage circuit each comprise NOR gates.

6. A register as in claim 1, further comprising an output circuit that converts the output signals from monotonic signals to register output signals.

7. A register as in claim 6, wherein the output circuit comprises cross-coupled logic gates.

8. A register as in claim 7, wherein the cross-coupled logic gates comprise NAND gates.

9. A register as in claim 7, wherein the cross-coupled logic gates comprise NOR gates.

10. A method for providing a register, the register receiving an input signal and providing output signals that represent true complementary logic values of the input signal, the method comprising:
    receiving into a first stage circuit the input signal and feedback signals, wherein the input signal is independent of a clocking signal;
    providing from the first stage circuit true and complementary intermediate signals derived from the logic value of the input signal, when the feedback signals are deactivated;
    receiving into a second stage circuit the clocking signal, the true and complementary intermediate signals, and the feedback signals;
    during a first phase of the clocking signal, deactivating the feedback signals, and pre-charging the output signals; and
    during a second phase of the clocking signal, activating the output signals and the feedback signals, the output signal being derived from the true and complementary intermediate signals and the activated feedback signals blocking propagation of the logic value of the input signal to the output signals.

11. A method as in claim 10, wherein the activated output signals also serve as the activated feedback signals.

12. A method as in claim 10, wherein the second stage circuit comprises cross-coupled logic gates enabled by the clocking signal.

13. A method as in claim 10 wherein the first stage circuit and the second stage circuit each comprise NAND gates.

14. A method as in claim 10, wherein the first stage circuit and the second stage circuit each comprise NOR gates.

15. A method as in claim 14, further comprising converting the output signals from monotonic signals to register output signals.

16. A method as in claim 15, wherein the converting uses an output circuit that comprises cross-coupled logic gates.

17. A method as in claim 16, wherein the cross-coupled logic gates comprise NAND gates.

18. A method as in claim 14, wherein the cross-coupled logic gates comprise NOR gates.

19. A register receiving a clock signal and an input logic value, and providing true and complement output logic values, comprising:
    an inverter receiving the input logic value and providing the complement logic value of the input logic value;
    a first logic gate receiving the input logic value and a first one of the true and complement output logic values to provide a first intermediate logic value;
    a second logic gate receiving the complement logic value of the input logic value and the other one of the true and complement output logic values to provide a second intermediate logic value;
    a third logic gate receiving the clock signal, the first intermediate value, and the other one of the true and complement output logic value, and providing the first one of the true and complement output logic value; and
    a fourth logic gate receiving the clock signal, the second intermediate value, and the first one of the true and complement output logic value, and providing the other one of the true and complement output logic values,
    wherein the input logic value is independent of the clock signal.

20. A register as in claim 19, further comprising a pair of cross-coupled logic gates receiving the true and complement output logic values and providing corresponding output logic values.

21. A register as in claim 19, wherein the first, second, third and fourth logic gates are NOR gates.

22. A register as in claim 19, wherein the first, second, third and fourth logic gates are NAND gates.

23. A register receiving an input signal and providing output signals that represent true complementary logic values of the input signal, comprising:
    means, receiving the input signal and feedback signals, for providing true and complementary intermediate signals derived from the logic value of the input signal when the feedback signals are deactivated, wherein the input signal is independent of a clocking signal; and
    means, receiving the clocking signal, the true and complementary intermediate signals, and the feedback signals, for providing the output signals,
    wherein (a) during a first phase of the clocking signal, the means for providing the output signals deactivates the feedback signals and pre-charges the output signals; and
    (b) during second phase of the clocking signal, the means for providing the output signals derives the output signals from the true and complementary intermediate signals, and thereafter activates the feedback signals to block further propagation of the logic value of the input signal from the means for providing true and complementary intermediate signals to the means for providing output signals.

24. A computer readable storage-medium containing a circuit description expressed in a hardware description language which, when interpreted by a computer, generates instructions for creating a register receiving an input signal and providing output signals that represent true complementary logic values of the input signal, the register comprising:
 a first stage circuit receiving the input signal and feedback signals, and providing true and complementary intermediate signals derived from the logic value of the input signal when the feedback signals are deactivated, wherein the input signal is independent of a clocking signal; and
 a second stage circuit receiving the clocking signal, the true and complementary intermediate signals, and the feedback signals,
 wherein (a) during a first phase of the clocking signal, the second stage circuit and pre-charges the output signals; and (b) during a second phase of the clocking signal, the second stage circuit derives output signals from the true and complementary intermediate signals, and thereafter activates the feedback signals to block further propagation of the logic value of the input signal from the first stage circuit to the second stage circuit.

* * * * *